(12) United States Patent
Mizutani et al.

(10) Patent No.: US 9,383,419 B2
(45) Date of Patent: Jul. 5, 2016

(54) MAGNETIC GRADIOMETER AND MAGNETIC SENSING METHOD

(75) Inventors: Natsuhiko Mizutani, Tokyo (JP); Tetsuo Kobayashi, Kyoto (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 824 days.

(21) Appl. No.: 13/814,231

(22) PCT Filed: Aug. 1, 2011

(86) PCT No.: PCT/JP2011/067999
§ 371 (c)(1),
(2), (4) Date: Feb. 4, 2013

(87) PCT Pub. No.: WO2012/020716
PCT Pub. Date: Feb. 16, 2012

(65) Prior Publication Data
US 2013/0127458 A1    May 23, 2013

(30) Foreign Application Priority Data
Aug. 13, 2010 (JP) ................................. 2010-181414

(51) Int. Cl.
*G01V 3/00* (2006.01)
*G01R 33/26* (2006.01)
*G01R 33/022* (2006.01)
*G01R 33/028* (2006.01)

(52) U.S. Cl.
CPC ............. *G01R 33/26* (2013.01); *G01R 33/022* (2013.01); *G01R 33/028* (2013.01)

(58) Field of Classification Search
CPC ...................................................... G01R 33/26
USPC .................................. 324/304, 302, 301, 300
See application file for complete search history.

(56) References Cited

U.S. PATENT DOCUMENTS

| 6,141,170 A | 10/2000 | Hatae et al. |
|---|---|---|
| 6,586,725 B2 | 7/2003 | Mizutani et al. |
| 6,603,557 B2 | 8/2003 | Mizutani |
| 6,785,003 B2 | 8/2004 | Mizutani et al. |
| 7,038,450 B2 | 5/2006 | Romalis et al. |
| 7,251,741 B2 | 7/2007 | Kobayashi et al. |
| 7,456,523 B2 | 11/2008 | Kobayashi |
| 8,054,074 B2 | 11/2011 | Ichihara et al. |

(Continued)

FOREIGN PATENT DOCUMENTS

| JP | 2009-162554 A | 7/2009 |
|---|---|---|
| JP | 2009-236598 A | 10/2009 |

OTHER PUBLICATIONS

U.S. Appl. No. 13/860,299, filed by Sunao Ichihara et al. on Apr. 10, 2013.

(Continued)

*Primary Examiner* — Louis Arana
(74) *Attorney, Agent, or Firm* — Fitzpatrick, Cella, Harper & Scinto

(57) ABSTRACT

A gradiometer in which a probe beam for reading sequentially passes through two magnetic field measurement regions to obtain signals according to magnetic flux densities of the respective regions is formed using an optically pumped magnetometer. In particular, in a gradiometer using a high sensitivity optically pumped magnetometer, a geometric arrangement enabling obtainment of a large signal from a dipole moment as a signal source is defined.

7 Claims, 4 Drawing Sheets

(56) References Cited

U.S. PATENT DOCUMENTS

| | | |
|---|---|---|
| 8,067,854 B2 | 11/2011 | Kobayashi |
| 8,587,304 B2 * | 11/2013 | Budker ............... G01R 33/26 324/304 |
| 2011/0193555 A1 | 8/2011 | Sugioka et al. |
| 2014/0354275 A1 * | 12/2014 | Sheng ............... G01R 33/26 324/244.1 |
| 2015/0130456 A1 * | 5/2015 | Smith ............... G01R 33/26 324/301 |
| 2015/0130457 A1 * | 5/2015 | Hokari ............... G01R 33/26 324/304 |

OTHER PUBLICATIONS

U.S. Appl. No. 13/725,840, filed by Natsuhiko Mizutani et al. on Dec. 21, 2012.

* cited by examiner

MAGNETIC GRADIOMETER AND MAGNETIC SENSING METHOD

TECHNICAL FIELD

The present invention relates to a magnetometer that measures a strength of a magnetic field. Specifically, the present invention relates to a gradiometer and a magnetic sensing method, which use an optically pumped magnetometer.

BACKGROUND ART

In many cases, for measuring a weak magnetic field, a magnetic gradiometer (hereinafter also simply referred to as "gradiometer") is formed using measurement data obtained by magnetometers for two or more magnetic field measurement regions. As an example of such gradiometer, a gradiometer using an optically pumped magnetometer is known. An optically pumped magnetometer applies a pump beam to a magnetic field measurement region with a group of gaseous atoms encapsulated therein to cause spin polarization and obtain a rotation of a polarization plane occurring when a probe beam for reading is made to pass through the region, as a signal according to a magnetic flux density of the region. Use of optically pumped magnetometers to obtain a difference between signals obtained in two respective magnetic field measurement regions when a probe beam has sequentially passed through the magnetic field measurement regions enables formation of a gradiometer. As an example of a high-sensitivity optically pumped magnetometer that can be used to form a gradiometer, U.S. Pat. No. 7,038,450 proposes an atomic magnetic sensor using a circularly-polarized beam as a pump beam and a linearly-polarized beam of light as a probe beam, for a cell in which alkali metal vapor is present.

However, for such gradiometer using optically pumped magnetometers, there have been no discussions ever before on an optimum geometric arrangement of a signal source and two magnetic field measurement regions and an optimum direction of a magnetic field to which the magnetometers respond in the two magnetic field measurement regions.

CITATION LIST

Patent Literature

PTL 1: U.S. Pat. No. 7,038,450

SUMMARY OF INVENTION

The present invention is directed to a gradiometer enabling higher sensitivity measurement of a magnetic field and S/N ratio improvement, which has been obtained as a result of studies on effects of an geometric arrangement of a signal source and two magnetic field measurement regions and a direction of a magnetic field to which the magnetometer respond in the two magnetic field measurement regions imposed on a gradiometer.

In a gradiometer using an optically pumped magnetometer according to the present invention, the gradiometer using the optically pumped magnetometer includes: a cell containing a group of atoms in a gaseous state, including an alkali metal, encapsulated therein; a pump beam source that applies a first pump beam and a second pump beam to the cell to spin-polarize the group of atoms, the first pump beam and the second pump beam being parallel to each other; a probe beam source that applies a probe beam to the cell; a detector for detecting a rotation of a polarization plane of the probe beam that has passed through the cell in a state in which the group of atoms is spin-polarized, wherein the first pump beam and the probe beam cross each other at a first measurement position, the second pump beam and the probe beam crosses each other at a second measurement position, the first measurement position and the second measurement position are arranged along a first direction that is linear with respect to a signal source, and the probe beam sequentially passes through the first measurement region and the second measurement region; wherein an alkali metal density, a measurement position length, a pump beam intensity and a spin polarization ratio for the first measurement position are the same as those of the second measurement position; and wherein each of a direction of a magnetic field measured at the first measurement position and a direction of a magnetic field measured at the second measurement position is the same as the first direction, a sign of spin polarization caused by optical pumping is different between the first measurement region and the second measurement region; and an angle of rotation of the polarization plane of the probe beam that has sequentially passed through each of the first measurement position and the second measurement position is obtained, thereby obtaining a difference in magnetic flux density between the first measurement position and the second measurement position.

According to the present invention, a gradiometer enabling high sensitivity measurement of a magnetic field from a magnetic moment, which is a signal source, and S/N ratio improvement can be formed.

Further features of the present invention will become apparent from the following description of exemplary embodiments with reference to the attached drawings.

DESCRIPTION OF EMBODIMENTS

Figure 1:
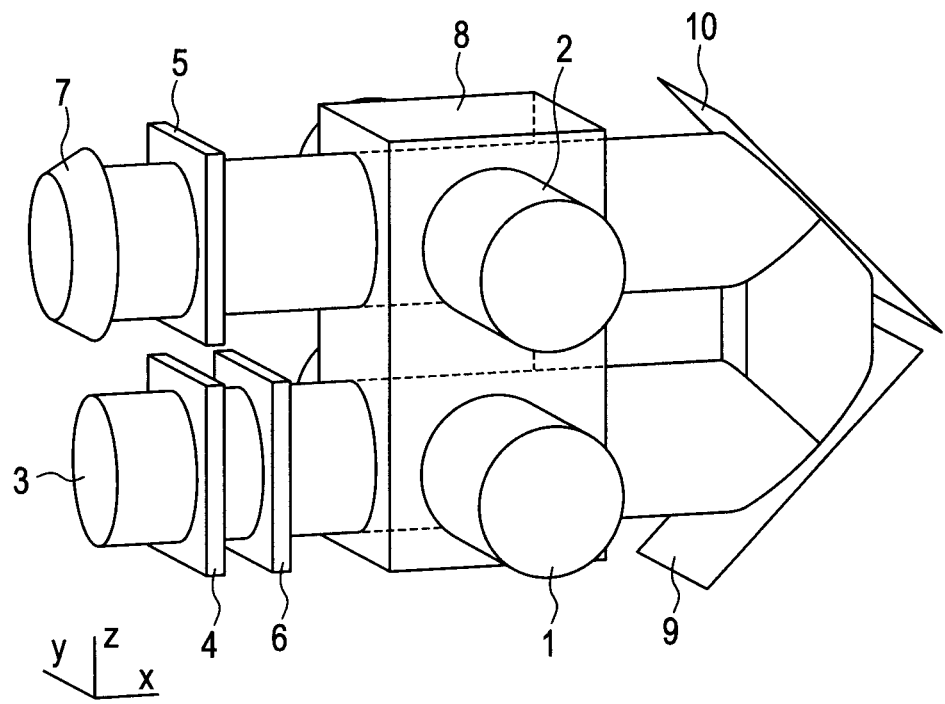
FIG. 1 is a schematic diagram illustrating a gradiometer according to a first example of the present invention.

An exemplary mode for carrying out the present invention will be described below based on an embodiment.

Gradiometer

First, a relationship between a configuration of a gradiometer and strengths of a signal and noise obtained by such configuration will be discussed. Considering a magnetic field produced by a magnetic moment $m_S$, a magnetic flux density vector $B(d)$ at a position away from the magnetic moment $m_S$, which is an attentioned magnetic signal source, by a distance vector $d$ can be expressed by $$B(d) = \frac{\mu_0}{4\pi} \left[ \frac{3n(n \cdot m_S) - m_S}{|d|^3} \right] \quad (1)$$

wherein $\mu_0$ is a vacuum magnetic permeability, a vector n is a unit vector pointing to a direction of the vector d. Based on expression (1), where the direction of the magnetic moment $m_S$ points to a direction from the signal source toward the magnetometer (direction of the vector n), a magnitude of the magnetic flux density vector at the position of the magnetometer can be expressed by $$|B(d)| = \mu_0 \times |m_S|/(2 \times d^3 \times \pi) \quad (2).$$

This is also a maximum value of the magnetic flux density that can be detected by the magnetometer under the condition that the absolute value of d, i.e., |d|, is constant.

Then, another magnetometer is arranged to form a gradiometer of a simple model in which the two magnetometers are arranged on a straight line and the direction of the magnetic moment $m_S$ points to a direction from the signal source toward the two magnetometers. Where distances to two magnetometers are $d_1$ and $d_2$ ($d_1 < d_2$), if a signal measured at the position of the distance $d_2$ is subtracted from a signal measured at the position of the distance $d_1$, a resulting signal S can be expressed by $$S = \mu_0 \times |m_S|/(2 \times \pi) \times (d_1^{-3} - d_2^{-3}) = \mu_0 \times |m_S|/(2 \times d_1^3 \times \pi) \times [1 - (d_1/d_2)^3] \quad (3).$$

For example, where $d_2 = 2 \times d_1$, it can be understood from expression (3) that the decrease of the signal remains at approximately ⅛. In other words, with this model, a strength of a magnetic signal from the vicinity of the sensor is substantially maintained.

Meanwhile, magnetic field noise from a position that is very farther than the attentioned signal source can also be considered as a magnetic field created by another magnetic moment $m_N$. Where distances from the magnetic moment $m_N$, which is a noise source, to the two magnetometers are $R_1$ and $R_2$, a noise component N from the noise source can be obtained by a signal measured at the position of the distance $R_2$ is subtracted from a signal measured at the position of the distance $R_1$, and can be expressed by $$N = \mu_0 \times |m_N|/(2 \times R_1^3 \times \pi) \times [1 - (R_1/R_2)^3] \quad (4).$$

Since $R_1 \approx R_2$ in the case of a distant noise source, it can be understood that in this model, noise described by a distantly-arranged magnetic moment can substantially be reduced.

As described above, a configuration in which two magnetic field measurement regions are arranged to be linear with respect to a signal source and a direction of a magnetic moment $m_S$ points to a direction from the signal source toward the two magnetic field measurement regions enables reduction of noise from a distance position while maintaining the strength of a magnetic signal from the vicinity of the sensor.

Optically Pumped Magnetometer

Next, an optically pumped magnetometer used in a gradiometer according to the present invention for magnetic signal detection will be discussed.

A. Principle of Operation of an Optically Pumped Magnetometer

First, operation of an optically pumped magnetometer will be described according to three steps below.

1) A pump beam is applied on an alkali metal gas encapsulated in a cell to orient spin of electrons in the atoms, thereby producing spin polarization. For the pump beam, a beam with a wavelength causing an optical transition from a ground level to an excited level, such as D1 transition of an alkali metal, is used. Where a circularly-polarized beam is used for the pump beam, the circularly-polarized beam is absorbed by the electrons in a particular spin state, providing an optical pumping effect, enabling provision of spin polarization for the alkali metal.

The spin polarization can be provided by circularly-polarized beam used as a pump beam because of conservation of angular momentum. A photon of circularly-polarized light has an angular momentum, and only a pair of a ground level and an excited level that can receive the angular momentum from the photon can be excited. For example, right-hand circularly-polarized light is selectively absorbed by a pair of a ground level and an excited level that increases an angular momentum of each electron by a quantum number of 1.

The once excited atoms return to the ground state after emitting randomly-polarized light by means of spontaneous emission, or through, e.g., collision with quencher gas atoms. In this state, atoms with their angular momentums decreased by a quantum number of 1 and atoms returning to the ground state with their angular momentums conserved are mixed. Hence, repetition of a random excitation and relaxation process increases the ratio of atoms in which the ground state are not excited by the circularly-polarized light. As a result, the direction of the spin of atoms included in the group of atoms are oriented in the direction of travel of the circularly-polarized light as an axis of the quantization.

In order to enhance the density of the alkali metal gas in the cell, the cell may be heated to a maximum of around 200° C.

2) Spin polarization of the alkali metal rotates upon reception of a torque in a magnetic field. It is known that use of optical Bloch equation (5) including effects of pumping and relaxation of optically-pumped spin enables description of the behavior of a spin polarization vector P in a magnetic field $$\frac{dP}{dt} = \frac{\gamma_e}{Q} B \times P - \Gamma_{eff} P + R \quad (5)$$

wherein $\gamma_e$ is a gyromagnetic ratio of an electron, Q is a slowdown factor depending on a spin polarization ratio, $\Gamma_{eff}$ is a spin relaxation rate, B is a magnetic field vector and R is a pumping vector.

3) Information on the spin polarization in the magnetic field is read by means of a probe beam which is a linearly-polarized beam. Where spin polarization has a component in the direction of propagation of the probe beam, the magnitude of the spin polarization can be read as a rotation of a polarization plane caused by a magnetooptic effect. For the probe beam, also, a beam with a wavelength around a resonant wavelength of the alkali metal is used. Thus, the wavelength is made to be detuned from a center of the resonance, thereby reducing effects of the probe beam on the optical absorption and the spin polarization.

The probe beam, which is a linearly-polarized beam, can be described as superimposition of both a left-hand circularly-polarized beam and a right-hand circularly-polarized beam. As also mentioned in the description of the pump beam, a circularly-polarized beam of light is absorbed by electrons in a particular spin state, and thus, if polarization occurs in the atom group, a difference in absorption occurs between the left-hand circularly-polarized beam and the right-hand circularly-polarized beam depending on the polarization. A difference in absorption coefficient means an imaginary part of a complex refractive index, and thus, a difference occurs between the real parts of the refractive indexes sensed by the left-hand circularly-polarized beam and the right-hand circularly-polarized beam according to the Kramers-Kronig relation. Therefore, use of a linearly-polarized beam obtained by superimposition of both a left-hand circularly-polarized beam and a right-hand circularly-polarized beam causes a difference in length between the optical paths of the left-hand circularly-polarized beam and the right-hand circularly-polarized beam when the linearly-polarized beam passing through the atom group, and thus, a rotation of the polarization plane is observed.

Since the angle of such rotation depends on the magnitude of the magnetic field, measurement of the angle of rotation of the polarization plane enables detection of the magnitude of the magnetic field.

Next, a relationship between a direction of a magnetic field measured by a magnetometer and a strength of an obtained signal will be described for two operating modes of an optically pumped magnetometer: a zero-magnetic field magnetometer and a resonant operation of a magnetometer.

B. Zero-Magnetic Field Magnetometer

In a state of a zero-magnetic field magnetometer, a magnetic field of a magnetic field measurement region in which an alkali metal gas, to which a pump beam and a probe beam are applied, is placed so as to adjust a strength to be no more than about 1 nT (nanotesla). The gyromagnetic ratio of an alkali metal is, e.g., 7 GHz/T for K, 4.6 GHz/T for $^{85}$Rb, 7 GHz/T for $^{87}$Rb and 3.5 GHz/T for Cs. In any case, for a magnetic field of no more than 1 nT, an optically pumped magnetometer acts as a zero-magnetic field magnetometer with a Larmor frequency of no more than 10 Hz. In this condition, in solving optical Bloch equation (5), the behavior of spin polarization can well be descried according to a stationary solution that temporal change of the spin polarization is zero.

In the zero-magnetic field magnetometer, spin polarization in proportion to a magnetic field of a component orthogonal to the pump beam and the probe beam is induced in the direction of the probe beam. In other words, the magnetometer has substantive sensitivity to a magnetic field in the direction orthogonal to both the pump beam and the probe beam.

When measuring a biometric magnetic field resulting from activities of a brain and/or a heart, a direction of a magnetic moment $m_S$ is not a parameter that a measurement system can select. Nevertheless, in order to confirm the fact that the strength of an obtained signal varies depending on the direction of a magnetic field measured by the magnetometer, the magnitude of the magnetic flux density is figured out based on expression (1) for two cases below.

(i) A case where the magnetic moment $m_S$ points to the direction of the vector n Since an n-direction component of a magnetic field is measured, a signal whose magnetic flux density has a magnitude of $\mu_0 \times 2|m_S|/(4\pi \times d_1^3)$ is measured.

(ii) A case where the magnetic moment $m_S$ points to a direction orthogonal to the vector n Since a component parallel to the magnetic moment $m_S$ is measured, a signal whose magnetic flux density has a magnitude of $-\mu_0 \times |m_S|/(4\pi \times d_1^3)$ is measured.

As can be seen from the above discussion, a larger signal can be observed in the case where the magnetic moment $m_S$ points to the direction of the vector n (case 1).

C. Resonant Operation of a Magnetometer

Also, a bias magnetic field of no less than 1 nT can be applied in the pump beam direction to make a magnetometer to perform a resonant operation. In this case, spin polarization resulting from optical pumping precesses at a Larmor frequency determined by the magnitude of the bias magnetic field with the direction of the bias magnetic field as a rotation axis. Motion of spin polarization with this magnetometer is described by means of, in particular, a stationary solution oscillating at a Larmor procession frequency from among the optical Bloch equation solutions.

This stationary solution is coupled with a magnetic field oscillating at a Larmor procession frequency, resulting in change in the direction of the spin polarization. From analysis of the optical Bloch equations, it is known that where a magnetometer performs a resonant operation, the magnetometer performs the resonant operation at a Larmor procession frequency for not only a magnetic field in the direction orthogonal to both the pump beam and the probe beam, but also a magnetic field in the probe direction.

A magnetic resonant signal is measured using such magnetometer. A state in which a magnetic moment $m_S$, which is a signal source, rotates by means of magnetic resonance at an angular frequency ω will be considered. For measurement of a magnetic field as a magnetic resonant signal at a position a distance $d_1$ away, the bias magnetic field in the magnetometer is adjusted to make the resonant frequency correspond to a rotation frequency of the magnetic moment within a resonance width. In this case, the magnitude of the detected signal varies depending on the combination of the direction of the axis of rotation of the magnetic moment $m_S$ and the direction of the magnetic field measured by the magnetometer. Based on expression (1), the magnitude of a signal for magnetic flux density observed in each case will be figured out.

When considering a signal resulting from rotational motion of a magnetic moment, attention may be paid only on a time-variable component of the magnetic moment, that is, a magnitude orthogonal to the axis of the rotation. In the below description, the magnetic moment $m_S$ is described as one pointing to a direction orthogonal to the axis of the rotation. Furthermore, the wavelength of an electromagnetic wave at a resonant frequency is sufficiently longer than an attentioned scale, and thus, can be handled with quasi-static approximation. Furthermore, φ represents the phase of oscillation.

1) A case where the axis of rotation in the magnetic resonance points to a direction pointing to the signal source viewed from the magnetometer 1-A: Magnetic flux density in the direction pointing to the signal source viewed from the magnetometer This direction is that of the axis of rotation, and thus, a magnetic flux density in this direction does not vary.

1-B: Magnetic flux density in the direction orthogonal to the axis of rotation

Since the term of the inner product of the vector, n·$m_S$, is zero in expression (1), a signal expressed by $$B(t)=[\mu_0 \times m_S/(4\pi \times d_1^3)] \times e^{(-i\omega t+\phi)} \qquad (6)$$

can be obtained.

2) A case where the axis of rotation in the magnetic resonance is orthogonal to the direction pointing to the signal source viewed from the magnetometer 2-A: Magnetic flux density in the direction pointing to the signal source viewed from the magnetometer (vector n direction)

Since the vector n(n·$m_S$) is observed for the second term within the square bracket in expression (1), a signal expressed by $$B(t)=[\mu_0 \times 2m_S/(4\pi \times d_1^3)] \times e^{(-i\omega t+\phi)} \qquad (7)$$

is measured.

2-B: Magnetic flux density in the direction parallel to the axis of rotation

Since contribution from $3n(n \cdot m_S)$ in the first term in the square bracket in expression (1) is zero, a signal expressed by $$B(t) = [\mu_0 \times m_S/(4\pi \times d_1^3)] \times e^{(-i\omega t + \phi)} \quad (8)$$

can be obtained according to the rotation of the vector $m_S$.

It can be understood from the above description that in observation of a magnetic resonant signal, where a magnetic field in the vector n direction is measured with an arrangement in which the axis of rotation in the magnetic resonance (direction of the pump beam) is orthogonal to the direction pointing to the signal source (vector n direction) viewed from the magnetometer (2-A), a signal with a magnitude twice those of the other cases can be observed.

In an optical gradiometer, also, provision of an arrangement in which the respective optically pumped magnetometers operate as described above according to each of a zero-magnetic field magnetometer and a resonant operation of a magnetometer enables extraction of a large signal, whereby higher sensitivity measurement can be made.

According to the knowledge described above, the present invention relates to a magnetometer using optically pumped magnetometers forming a configuration in which two magnetic field measurement regions are arranged so as to be linear with respect to a signal source, and a direction of a magnetic moment $m_S$ points a direction from the signal source to the two magnetic field measurement regions (vector n direction).

Furthermore, in the zero-magnetic field magnetometer, a magnetic force can be measured for a magnetic field in a direction orthogonal to both a pump beam and a probe beam.

Furthermore, in a resonant operation of the magnetometer, a magnetic force may be measured for not only a magnetic field in the direction orthogonal to both the pump beam and the probe beam but also a magnetic field in the probe direction.

Specific examples of a gradiometer according to the present invention, which has a configuration such as described above, will be indicated below. However, the present invention is not limited to the below examples.

Example 1

In FIG. 1, laser beams 1 and 2 for pumping, which are circularly-polarized beams, are generated from non-illustrated pump beam sources. The laser beams 1 and 2 propagate in parallel to each other in a positive y axis direction. Both are circularly-polarized beams in a same direction. A laser beam 3 for probe is generated from a non-illustrated probe beam source, a cell 8 contains alkali metal encapsulated therein. Polarizing plates 4 and 5 form a crossed nicol arrangement that does not transmit light when no polarization plane rotation occurs in the glass cell. A photodetector 7 receives the probe beam. Mirrors 9 and 10 turn the pump beam back. It is desirable that the mirrors have a high reflectivity for an incident angle of 45 degrees and are dielectric multilayer mirrors designed to reduce the difference in complex reflectivity between p wave and s wave. A faraday modulator 6 is driven by a modulation signal with a frequency $\omega_F$ from a non-illustrated signal source to modulate a polarization plane of the probe beam, which is a linearly-polarized beam, with an angle $\alpha$ and the frequency $\omega_F$. Where $\phi$ is the angle of rotation of the polarization plane caused by a magnetic field in the cell, an intensity I of the light passing through a pair of a polarizer and an analyzer in a crossed nicol arrangement can be expressed by $$I = I_0 \sin^2[\phi + \alpha\sin(\omega_F t)] \quad (9)$$

$$\approx I_0[\phi^2 + 2\phi\alpha\sin(\omega_F t) + \alpha^2\sin^2(\omega_F t)]$$

In other words, a frequency $\omega_F$ component of the intensity of the light has an amount proportional to $2I_0\alpha\phi$ and the angle of rotation of the polarization plane.

An optical path of the laser beam for probe has a route starting from a lower left portion of the Figure and extending through a route from the polarizing plate 4, the faraday modulator 6, the cell 8, the mirror 9, the mirror 10, the cell 8, the polarizing plate 5 and the photodetector 7 in this order. Along this route, a region in which the first pump beam 1 and the probe beam 3 cross each other is a first measurement position, and a region in which the probe beam turned back by the mirrors 9 and 10 crosses the second pump beam 2 is a second measurement position. This configuration provides a configuration in which the first measurement position and the second measurement position are arranged along a direction linear with respect to a signal source (first direction). Here, the polarization plane of the probe beam rotates according to the value of $B_{z1}$, which is a z component of a magnetic flux density in the first measurement position, and the value of $B_{z2}$, which a z component of magnetic flux density in the second measurement position.

The cell 8 consists of a material transparent to the probe beam and the pump beams, such as glass. The cell contains K in a gaseous state, which is hermetically encapsulated. In the cell, a gas functioning as a buffer, such as He, and/or an $N_2$ gas can also be encapsulated in addition to the atom group. Since a buffer gas suppress diffusion of polarized alkali metal atoms, it is effective to suppress spin relaxation occurring due to collision with the cell walls, thereby enhancing the polarization ratio. Furthermore, an $N_2$ gas is a quencher gas that draws energy from K in an excited state to suppress light emission of K, and is effective for producing large spin polarization in the alkali metal gas by means of pumping.

A potassium metal is placed in a glass cell and heated to around 180° C., enabling the glass cell to be filled with potassium metal vapor with a number density of around $10^{14}$ cm$^{-3}$. Here, the cell is placed in a non-illustrated oven for heating, and heated to a desired temperature by hot air circulating in the oven.

Furthermore, in the present example, a non-illustrated magnetic shield and a three-axis Helmholtz coil system are used to decrease geomagnetism and an environmental magnetic field around the cell 8 to no more than 1 nT.

In the first measurement position, y-direction spin polarization is produced by the first pump beam 1, which is a circularly-polarized beam $\sigma^+$. Where a z-direction magnetic field $B_{z1}$ is positive, positive spin polarization occurs in the x direction. Here, since the probe beam 2, which is a linearly-polarized beam, passing through the first measurement position, travels in the same direction as that of the spin polarization produced by the pump beam, and thus, the polarization plane makes right-hand rotation according to the magnitude of the spin polarization.

The optical path of the probe beam is turned back by the mirrors 9 and 10 to the cell 8 again. Similarly, in the second measurement position, y-direction spin polarization is produced by the second pump beam 2, which is also a circularly-polarized beam $\sigma^+$, and where a z-direction magnetic field $B_{z2}$ is positive, positive spin polarization occurs in the x direction, too. Here, as opposed to the first measurement position, the probe beam 2 propagates in a direction opposite to the direction of the spin polarization, and thus, the polarization plane makes left-hand rotation according to the magnitude of the spin polarization.

Where a rotation angle $\phi$ of the polarization plane is represented by a mathematical expression, it can be expressed by $$\phi = cr_e fnlP_x Re[L(\nu)] \qquad (10)$$

Here, $\nu$ is the frequency of the probe beam, n is an atomic density of an alkali metal, c is a speed of the light, and $r_e$ ($=2.82\times10^{-15}$ m) is a classical electron radius. Furthermore, f is an oscillator strength of optical transition, l is a length of a measurement position, $P_x$ is a magnitude of the x-direction spin polarization (up to 1), $L(\nu)$ is a complex Lorenz function of a center wavelength $\nu_0$ and a full width at half maximum $\Delta\nu$ representing a shape of an absorption line. Here, when the probe beam is made to propagate in the opposite direction in the measurement position 2, it should be noted that a negative sign is added further to expression (10).

A specific magnitude of the x-direction spin polarization $P_x$ can be figured out from optical Bloch equation (5). Considering a pumping vector R=(0, R, 0), which is y-direction pumping, $$P_x = \frac{R(\gamma_e B_z / Q)}{\Gamma_{eff}^2 + (\gamma_e B_z / Q)^2} \qquad (11)$$

can be obtained as a stationary solution. Based on expression (11), it can be understood that if $B_z$ is so small that $\Gamma_{eff} > \gamma_e B_z/Q$ can be provided, a $P_x$ which is substantially proportional to $B_z$ can be obtained. Combining expressions (10) and (11), it is also clear that the rotation angle $\phi$ of the polarization plane is proportional to $B_z$. If this relationship is represented by $\phi = \alpha B_z$, the rotation angle of the polarization plane of the probe beam that has sequentially passed through the first measurement position and the second measurement position can be expressed by $$\phi = \alpha_{A1} B_{z1} - \alpha_{A2} B_{z2} = \alpha(B_{z1} - B_{z2}) \qquad (12)$$

and thus, the rotation angle of the polarization plane of the probe beam incident on the photodetector is an amount resulting from magnetic field subtraction as a gradiometer. The latter equal sign in expression (12) is provided where proportionality coefficients $\alpha_{A1}$ and $\alpha_{A2}$ of the rotation angles relative to the magnetic fields at the respective measurement positions are substantially equal to each other. Referring to expressions (10) and (11), it can be understood that examples of parameters to be uniformed to make $\alpha_{A1}$ and $\alpha_{A2}$ to be equal to each other include, e.g., the alkali metal density n, the length of the measurement position l the pumping vector R (the intensity of the pump beam), the spin polarization ratio (absolute value of the spin polarization vector P), and a slow-down factor Q, which will be determined later.

Under the condition that photon shot noise restricts the sensitivity, the gradiometer configured as described above provides signal/noise ratio improvement twice the gradiometer in which probe beams are made to pass through two independent measurement positions, respectively, to detect rotations of the respective polarization planes by means of photodetectors (comparison example). The principle will be described below.

Here, $P_0$ is the number of photons provided to each of the gradiometers according to comparative example and the present example per unit time. In comparative example, the photons to be provided are divided in half and used, and thus, the signal in each photodetector is proportional to $P_0/2$. Furthermore, shot noise in each photodetector is proporational to $(P_0/2)^{1/2}$. For the signal, subtraction of the signals from each other results in obtainment of the strength proportional to $P_0/2$. Meanwhile, even though "subtraction" is performed, random ones are added up for the noise, resulting in $(P_0/2+P_0/2)^{1/2} = P_0^{1/2}$. Accordingly, the S/N ratio in comparative example is proportional to an amount expressed by $$P_0^{1/2}/2 \qquad (13).$$

Meanwhile, in the present example, the signal in the photodetector is proportional to $P_0$, and the shot noise in the photodetector is proportional to $P_0^{1/2}$. Therefore, the S/N ratio is proportional to $$P_0^{1/2} \qquad (14).$$

Comparing expressions (13) and (14), it can be understood that the present example enables provision of a doubled S/N ratio in measurement using a same number of photons.

A magnetic moment, which is a signal source, is arranged in a negative direction on a z-axis in the Figure. As already described above, measurement of a z component of a magnetic field in each of the first measurement region and the second measurement region arranged to be linear with respect to the signal source results in measurement of relatively large magnetic signals, enabling provision of high sensitivity.

For the turns of the optical path via the mirrors 9 and 10, it is desirable to employ a mirror configuration that reduces its effects on the polarization plane of the probe beam.

Fresnel reflection via a mirror exhibits different reflectivities for p-wave and s-wave. Here, a p-wave is a polarized wave of light whose electric field vector is present on an incident plane, and an s-wave is a polarized wave of light whose electric field vector is orthogonal to an incident plane. Use of dielectric multilayer mirrors enables suppression of the difference in reflectivity between p-wave and s-wave to no more than 1%, which is desirable as a method for turning an optical path; however, this case also requires the reflection phases to be taken into consideration.

For optical path turning in a gradiometer such as that in the present example, two examples of an optical configuration avoiding the effects of Fresnel reflectivity's dependency on the polarization plane are indicated below.

Figures 2A, 2B:
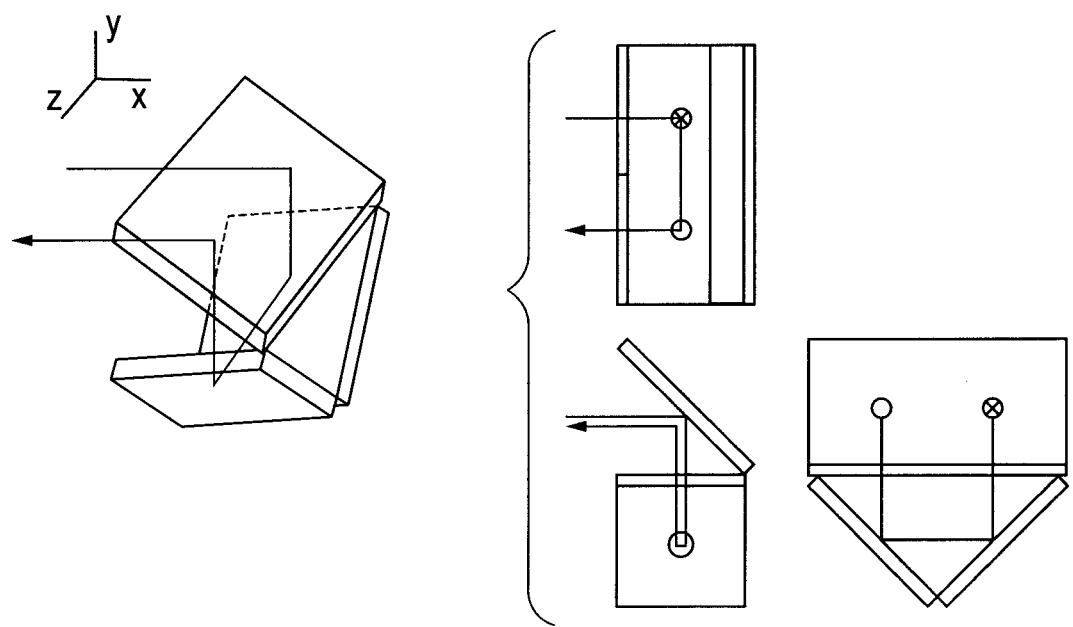
FIGS. 2A and 2B are schematic diagrams illustrating a mirror used in a variation of the first example of the present invention.

1) There are known dielectric multilayer mirrors with a configuration exhibiting a high reflectivity for both p-wave and s-wave with a 45-degree incidence. In such high reflectivity mirrors, phases of reflection are not uniform but diffused depending on the wavelengths. Therefore, in order to enable precise measurement of the polarization plane, an optical system that turns an optical path through a reflection route including a plurality of reflective planes, such as illustrated in FIGS. 2A and 2B, is used. In this optical system, on a plane including an optical path for light to enter the optical system and an optical path for light to exit from the optical system, there are two reflections whose angle of incident on a mirror is 45 degree. Furthermore, on a plane perpendicular to the optical path for light to enter the optical system and the optical path for light to exit from the optical system, there are two reflections whose angle of incidence on respective mirrors is 45 degrees. As a result, in the reflection route of light with an $e_y$ polarized wave, the reflections occur for the p-wave, the s-wave, the s-wave and the p-wave in this order, while in the reflection route of light with an $e_z$ polarized wave, the reflections occurs for the s-wave, the p-wave, the p-wave and the s-wave in this order.

FIG. 2A is a perspective view of the mirrors, and FIG. 2B illustrates three planes of the mirrors using trigonometry. Consequently, a phase shift amount resulting from the reflections in the entire optical path turn is the same regardless of the p-wave incidence or the s-wave incidence, enable elimination of the effect of the optical path turn on measurement of the polarization plane.

Figure 3A:
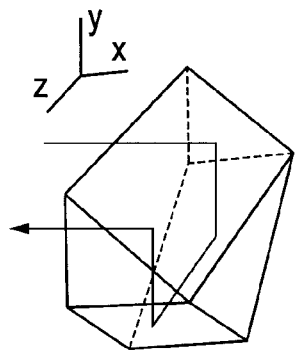
FIGS. 3A and 3B are schematic diagrams illustrating a total reflection prism used in a variation of the first example of the present invention.
Figure 3B:
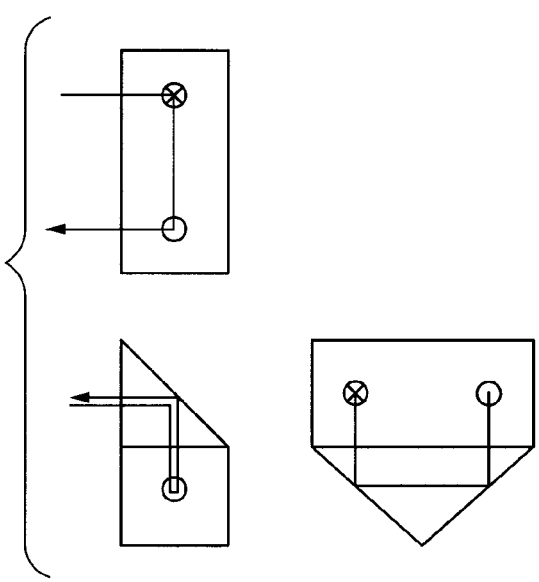

2) As a unit for substituting the reflections via the mirrors 9 and 10, it is possible to turn the optical path by means of total reflection using a prism. In total reflection, there is a difference in phase shift amount due to reflection between p-waves and s-waves, hindering precise measurement of a rotation of the polarization plane. Therefore, use of a prism such as illustrated in FIGS. 3A and 3B enables provision of an optical system with an optical path turn in which in a route of the optical path turn, there are a sum of four total reflections, i.e., two total reflections for incidence of a p wave and two total reflections for incidence of a s wave. In other words, in the total reflection route of light with the $e_y$ polarized wave, the reflections occur for the p wave, the s wave, the s wave and the p wave in this order, while in the total reflection route for light with the $e_z$ polarized wave, reflections occur for the s-wave, the p-wave, the p-wave and the s-wave in this order.

FIG. 3A is a perspective view of the prism, and FIG. 3B illustrates three planes of the prism using trigonometry.

Although an example has been provided focusing on an operation of a zero-magnetic field magnetometer here, a resonant operation can be performed using the same configuration.

The resonant operation can be performed by adjusting a current flowing in the non-illustrated Helmholtz coil system to apply a bias magnetic field in the pump beam direction, thereby making the spinning of the alkali metal to precess at a frequency ω. The arrangement according to this example is particularly favorable for measurement of an oscillating magnetic field in the $B_z$ direction by resonant operation.

Example 2

Figure 4:
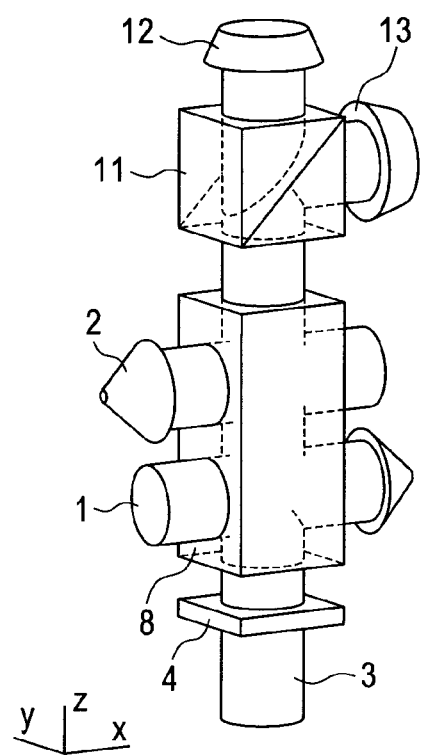
FIG. 4 is a schematic diagram illustrating a gradiometer according to a second example of the present invention.

FIG. 4 illustrates another configuration of a gradiometer using magnetometers using a resonant operation. The second example is different from the first example in that no optical turn using mirrors is provided on an optical path of probe beam.

The second example is characterized in an arrangement in which a first pump beam 1 and a second pump beam 2, which correspond to two measurement regions, respectively, are circularly-polarized beams that rotate along a same direction but are incident on the cell 8 in directions opposite to each other, which is the difference from that of the first example. The circularly-polarized beams may have either right-hand rotation or left-hand rotation as long as the circularly-polarized beams rotate along the same direction. Furthermore, in the present example, there is a system that detects a rotation of a polarization plane by means of a balance photodetector including a polarization separation optical element 11 and photodetectors 12 and 13.

A first measurement region is a region in which a probe beam 3 made to be a linearly-polarized beam by a polarizer 4 cross the first pump beam 1, which is the circularly-polarized beam with right-handed rotation and is arranged inside a cell 8. Here, a DC current is made to flow in a non-illustrated Helmholtz coil pair to apply a magnetostatic field to the entire cell in an x-direction. A magnetostaic field of around 0.7 μT is applied so that spin polarization of potassium excited in the cell precesses at a Larmor frequency of 5 kHz. The first pump beam 1 produces spin polarization in the x direction, and this spin polarization resonates with oscillating magnetic field components of around 5 kHz while precessing at 5 kHz. Here, the magnetometer has sensitivity to, in particular, y-direction and z-direction magnetic fields. Consequently, according to $B_y$ and $B_z$ magnetic fields oscillating at the resonant frequency, a z-component of the spin polarization oscillating at that frequency occurs, and thus, an angle of rotation of the polarization plane of the probe beam passing through the first measurement region is one periodically modulated at a resonant frequency of 5 kHz.

Similarly, in the second measurement region in which the second pump beam 2, which is a circularly-polarized beam with right-hand rotation, and the probe beam 3 cross each other in the cell 8, spin polarization is produced by the pump beam, an x-component of the spin polarization is one having a sign that is the reverse of that of the spin polarization in the first measurement region. A bias magnetic field, which has already been described, is applied also to the second measurement region, and the spin polarizations have precession motion in a same direction (without depending on the signs of the respective polarizations). Furthermore, as with the resonance in the first measurement region, a z-direction component is generated in the spin polarization as a result of resonance with an oscillating magnetic field. Under the condition that resonant magnetic fields of a completely same magnitude and direction are measured in the first measurement region and the second measurement region (this is an assumed condition for description), the z-direction spin polarization has a sign opposite to that of the first measurement region, reflecting the reverse sign of the x-direction spin polarization. Therefore, an angle of rotation of the polarization plane of the probe beam passing through the second measurement region is one further periodically modulated at a resonant frequency of 5 kHz, contribution of the polarization plane rotation in the second region is one with a sign opposite to that of contribution in the first region.

Thus, it can be understood that the angle of rotation of the polarization plane of the probe beam sequentially passed through the first measurement position and the second measurement position can be expressed by $$\phi = \alpha_{A1} B_{z1} - \alpha_{A1} B_{z2} = \alpha_{A1}(B_{z1} - B_{z2}),$$

which enables formation of a magnetic field gradiometer.

A direction of a polarizer 4 determining the polarization plane of the probe beam is adjusted so that when the angle of rotation of the polarization plane in the cell 8 is 0, an amount of reflected light and an amount of transmitted light in the polarized beam splitter 11 are equal to each other. In other words, an arrangement is made so that a polarizing axis of the polarized beam splitter 11 and a polarization plane of light passing through the polarizer 4 form an angle of 45 degrees. Obtainment of a difference between optical power received by the photodetector 12 and optical power received by the photodetector 13 enables extraction of an electric signal according to the angle of rotation of the polarization plane.

For a layout for obtaining a magnetic resonant signal, a magnetic moment, which is a signal source rotating by means of magnetic resonance, is arranged at a negative position on the z axis in the Figure. As already described, measurement of a z-component of a magnetic field in each of the first and second measurement regions arranged to be linear with respect to the signal source results in measurement of relatively large magnetic signals, enabling provision of high sensitivity. In such arrangement, in order to prevent the distance between the first measurement region and the signal source from being large, it is effective to bend an optical path of the probe beam entering the polarizer 4 in the Figure, using an optical path changing unit such as a non-illustrated mirror or a prism.

For magnetic field measurement using a resonant operation, not only rotation of a magnetic moment, which is a signal source, and rotation of spin polarization to have frequencies corresponding to each other or falling within a range of a resonance width, but also the rotation directions to be correspond to each other, is required. Therefore, it is necessary that a direction of the bias magnetic field $B_z$ applied to the cell 8 correspond to a direction of a x-component of a magnetostatic field $B_0$ in which the signal source is placed for generating magnetic resonance in the signal source. Furthermore, a magnitude of the magnetic field should be selected according to a gyromagnetic ratio of a nuclide used for the magnetic resonance.

Figure 5:
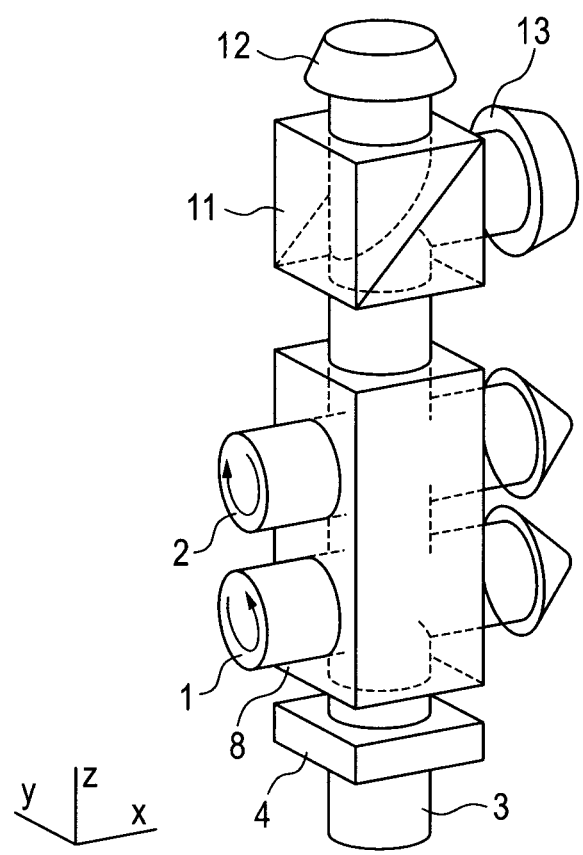
FIG. 5 is a schematic diagram illustrating a gradiometer according to a variation of the second example of the present invention.

In order to achieve a state in which signs of spin polarization generated in the first measurement region and in the second measurement region as a result of optical pumping are different from each other, another configuration can also be employed. In a variation of the present example, which is illustrated in FIG. 5, a first pump beam 1 and a second pump beam 2 corresponding to two measurement regions are circularly-polarized beams propagating in a same direction, but directions of rotations of the circularly-polarized beams are different from each other, causing spin polarization to be generated in the first measurement region and the second measurement region in directions opposite to each other.

Operation of the magnetometer using a resonant operation is similar to that of the present example described, and thus, description thereof will be omitted.

Example 3

Figure 6:
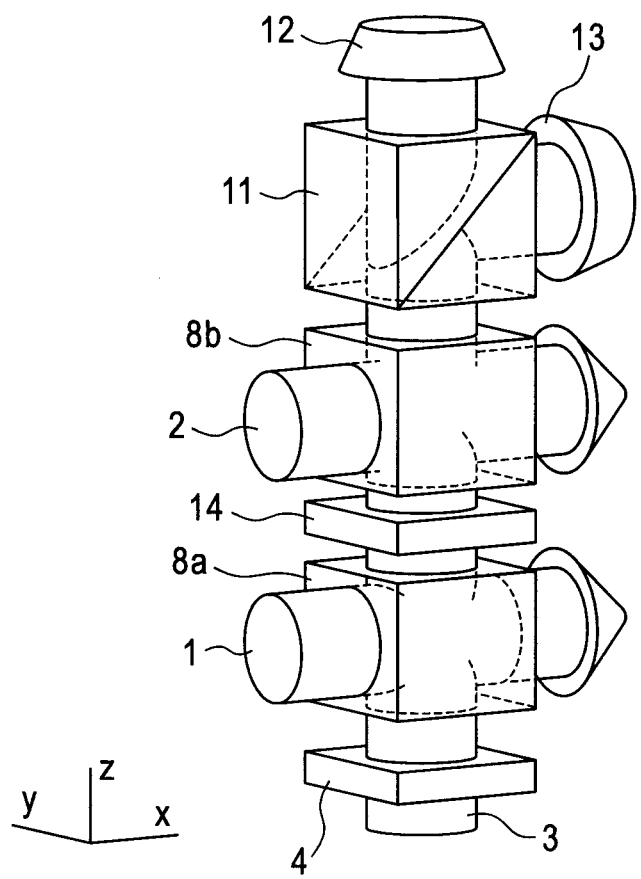
FIG. 6 is a schematic diagram illustrating a gradiometer according to a third example of the present invention.

Another example in which rotations of a polarization plane of a probe beam by a magnetic field, which are measured in a first measurement region and a second measurement region, have directions opposite to each other will be described with reference to FIG. 6. In FIG. 6, a half-wave plate 14 is inserted between the first measurement region and the second measurement region along an optical path of the probe beam. A crystal axis direction of the half-wave plate 14 is made to correspond to a direction of a polarization plane of light passing through a polarizer 4. Where $\phi$ is a rotation of the polarization plane in the first measurement region, an angle of rotation of the polarization plane of the probe beam passing through the half-wave plate 14 is $-\phi$. This is because change of a polarization state when the probe beam passing through the half-wave plate arranged as described above can be expressed by the following matrix where a set of electric field vectors $(e_x, e_y)^T$ is a base thereof.

$$\exp(i\varphi)\begin{pmatrix} 1 & 0 \\ 0 & -1 \end{pmatrix}$$

Although FIG. 6 illustrates that a cell 8a and a cell 8b are independent cells, it is necessary to make a first measurement position and a second measurement position correspond to each other in terms of, e.g., alkali metal density n, measurement position length l pumping vector R, spin polarization ratio and slowdown factor Q which will be determined later as in example 1. Thus, a configuration in which these cells are interconnected via a non-illustrated path may be employed. The interconnection of the cells as described above is effective to provide a common alkali metal density in the two measurement regions to make the two measurement regions in the gradiometer have equal parameters.

Although the polarization plane of the probe beam subsequently passing through the second measurement region further rotates, contribution of the polarization plane rotation in the second region has a sign opposite to that of contribution in the first region.

Furthermore, in the present example, as in the second example, a resonant operation of a magnetometer is performed on a y-direction bias magnetic field, providing sensitivity to $B_z$, enabling a gradiometer that measures a large signal from a magnetic moment. While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-181414, filed Aug. 13, 2010, which is hereby incorporated by reference herein in its entirety.

The invention claimed is:

1. A gradiometer using an optically pumped magnetometer, the gradiometer using the optically pumped magnetometer comprising: one or more cells each containing a group of atoms in a gaseous state, including an alkali metal, encapsulated therein; a pump beam source that applies a first pump beam and a second pump beam to each of the one or more cells to spin-polarize the group of atoms, the first pump beam and the second pump beam being parallel to each other; a probe beam source that applies a probe beam to the one or more cells to which the pump beams have been applied; a detector for detecting a rotation of a polarization plane of the probe beam that has passed through the one or more cells in a state in which the group of atoms is spin-polarized, wherein the first pump beam and the probe beam cross each other at a first measurement position, the second pump beam and the probe beam crosses each other at a second measurement position, the first measurement position and the second measurement position are arranged along a first direction that is linear with respect to a signal source, and the probe beam sequentially passes through the first measurement region and the second measurement region;

wherein an alkali metal density, a measurement position length, a pump beam intensity and a spin polarization ratio for the first measurement position are the same as those of the second measurement position; and wherein each of a direction of a magnetic field measured at the first measurement position and a direction of a magnetic field measured at the second measurement position is the same as the first direction, a sign of spin polarization caused by optical pumping is different between the first measurement region and the second measurement region; and an angle of rotation of the polarization plane of the probe beam that has sequentially passed through each of the first measurement position and the second measurement position is obtained, thereby obtaining a difference in magnetic flux density between the first measurement position and the second measurement position.

2. The gradiometer using the optically pumped magnetometer according to claim 1, wherein a direction of the rotation of the polarization plane of the probe beam at the first measurement position is opposite to a direction of the rotation of the polarization plane of the probe beam at the second measurement position.

3. The gradiometer using the optically pumped magnetometer according to claim 1, comprising a half-wave plate between the first measurement region and the second measurement region.

4. The gradiometer using the optically pumped magnetometer according to claim 2, wherein the first measurement position and the second measurement position are provided in a same one of the one or more cells; and an optical path changing unit for reversing a direction of travel of the probe beam that has passed through the first measurement position to make the probe beam pass through the second measurement position is provided.

5. The gradiometer using the optically pumped magnetometer according to claim 2, wherein the first measurement position and the second measurement position are provided in a same one of the one or more cells; the first pump beam applied to the first measurement position and the second pump beam applied to the second measurement position both have one of right-hand circular polarization and left-hand circular polarization; and the first pump beam and the second pump beam propagate in the one or more cells in directions opposite to each other.

6. The gradiometer using the optically pumped magnetometer according to claim 2, wherein the first measurement position and the second measurement position are provided in a same one of the one or more cells; the first pump beam applied to the first measurement position and the second pump beam applied to the second measurement position are circularly-polarized beams whose directions of rotation are different from each other; and the first pump beam and the second pump beam both propagate in the cell in a same direction.

7. The gradiometer using the optically pumped magnetometer according to claim 4,
wherein the optical path changing unit includes an optical element including a plurality of reflective planes; wherein an optical path of the optical element includes two reflections, in which an angle of incident on a mirror is 45 degrees, on a plane including an optical path in which light enters the optical element and an optical path in which light exits from the optical element; and the optical path of the optical element includes two reflections, in which an angle of incident on a mirror is 45 degrees, on a plane perpendicular to the optical path in which light enters the optical element and the optical path in which light exits from the optical element.

* * * * *